United States Patent [19]

Suzuki et al.

[11] Patent Number: 4,888,614
[45] Date of Patent: Dec. 19, 1989

[54] OBSERVATION SYSTEM FOR A PROJECTION EXPOSURE APPARATUS

[75] Inventors: Akiyoshi Suzuki, Tokyo; Hideki Ina, Kawasaki; Masao Kosugi, Yokohama, all of Japan

[73] Assignee: Canon Kabushiki Kaisha, Tokyo, Japan

[21] Appl. No.: 333,727

[22] Filed: Apr. 3, 1989

Related U.S. Application Data

[63] Continuation of Ser. No. 253,895, Oct. 5, 1988, abandoned, which is a continuation of Ser. No. 168,630, Feb. 23, 1988, abandoned, which is a continuation of Ser. No. 54,861, May 27, 1987, abandoned.

[30] Foreign Application Priority Data

May 30, 1986 [JP] Japan .................. 61-125102
Jun. 13, 1986 [JP] Japan .................. 61-136182

[51] Int. Cl.⁴ .................. G03B 27/52; G03B 27/70; G03B 27/28; G03B 27/42
[52] U.S. Cl. .................. 355/43; 355/45; 355/53
[58] Field of Search .................. 355/41, 43, 45, 53, 355/77; 356/152, 394, 399, 237, 400; 33/613; 350/169, 504; 353/101, 122; 29/578

[56] References Cited

U.S. PATENT DOCUMENTS

| | | | |
|---|---|---|---|
| 3,963,353 | 6/1976 | Hemstreet | 356/168 |
| 4,215,934 | 8/1980 | Karasawa et al. | 355/45 X |
| 4,422,755 | 12/1983 | Phillips | 355/45 X |
| 4,437,758 | 3/1984 | Suzuki | 355/41 |
| 4,441,250 | 4/1984 | Imahashi | 29/578 |
| 4,473,293 | 9/1984 | Phillips | 355/45 X |
| 4,530,082 | 7/1985 | Howe et al. | 369/112 |
| 4,573,791 | 3/1986 | Phillips | 355/45 X |
| 4,592,650 | 6/1986 | Tabarelli et al. | 355/43 X |
| 4,595,289 | 6/1986 | Feldman et al. | 356/237 |
| 4,601,577 | 7/1986 | Gotou et al. | 356/237 |
| 4,619,524 | 10/1986 | Tabarelli et al. | 355/43 X |
| 4,657,379 | 4/1987 | Suwa | 355/43 X |
| 4,660,966 | 4/1987 | Kato et al. | 355/45 X |
| 4,668,077 | 5/1987 | Tanaka | 355/43 X |
| 4,681,430 | 7/1987 | Goel et al. | 355/53 X |
| 4,687,322 | 8/1987 | Tanimoto et al. | 355/43 X |
| 4,690,529 | 9/1987 | Sugiyama et al. | 355/43 X |
| 4,704,020 | 11/1987 | Murakami et al. | 355/53 X |

FOREIGN PATENT DOCUMENTS

60-214335 11/1984 Japan .

Primary Examiner—Richard A. Wintercorn
Attorney, Agent, or Firm—Fitzpatrick, Cella, Harper & Scinto

[57] ABSTRACT

An observation system, usable with a projection optical system for optically projecting a first object upon a second object by use of a light of a first wavelength, for observing the second object by way of the projection optical system and by use of a light of a second wavelength different from the first wavelength. The observation system includes an observation optical system having a lens element and a parallel-surface plate which is inclined with respect to an optical axis of the observation optical system, wherein the observation optical system is arranged to form an image of the second object on a predetermined image surface and wherein the parallel-surface plate is arranged to substantially correct coma caused by the projection optical system.

43 Claims, 7 Drawing Sheets

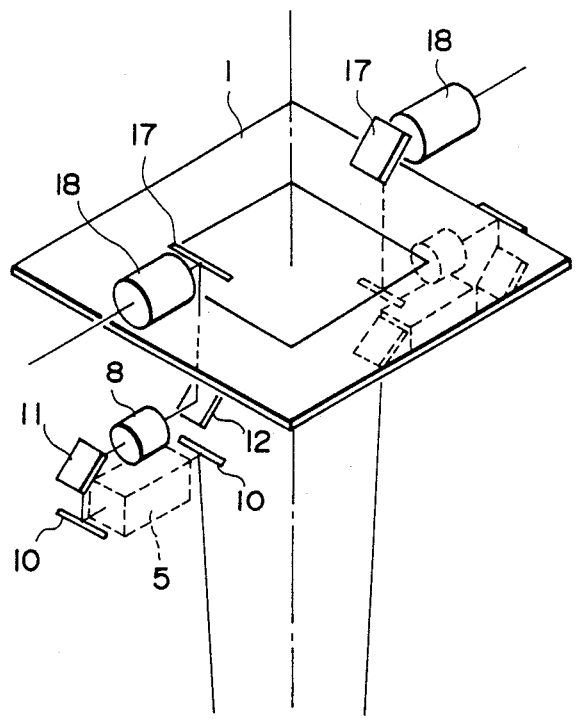
F I G. 2
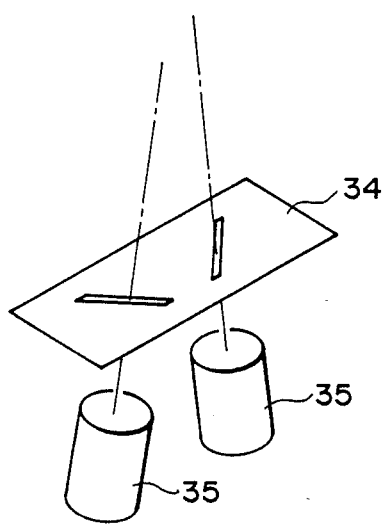
F I G. 4

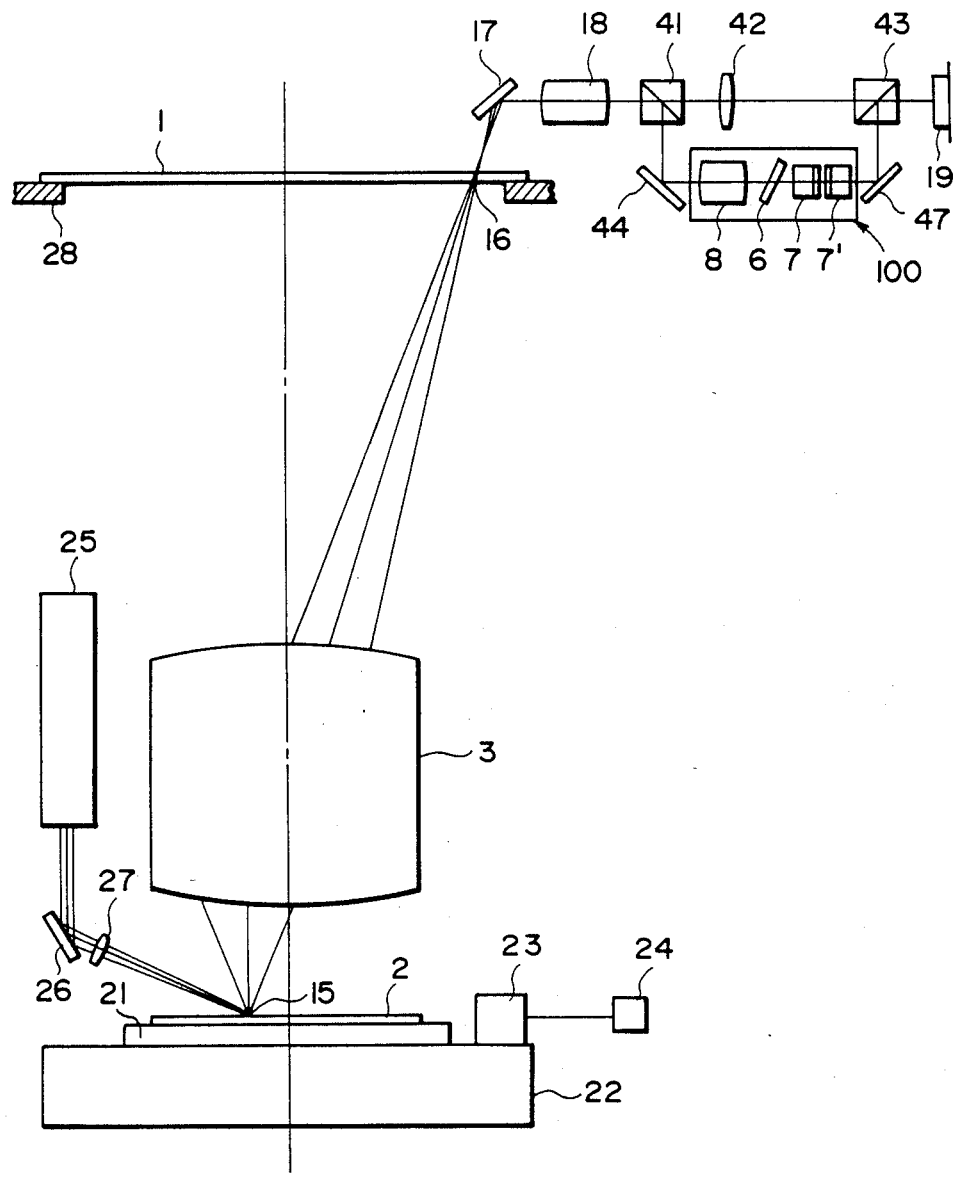
F I G. 5

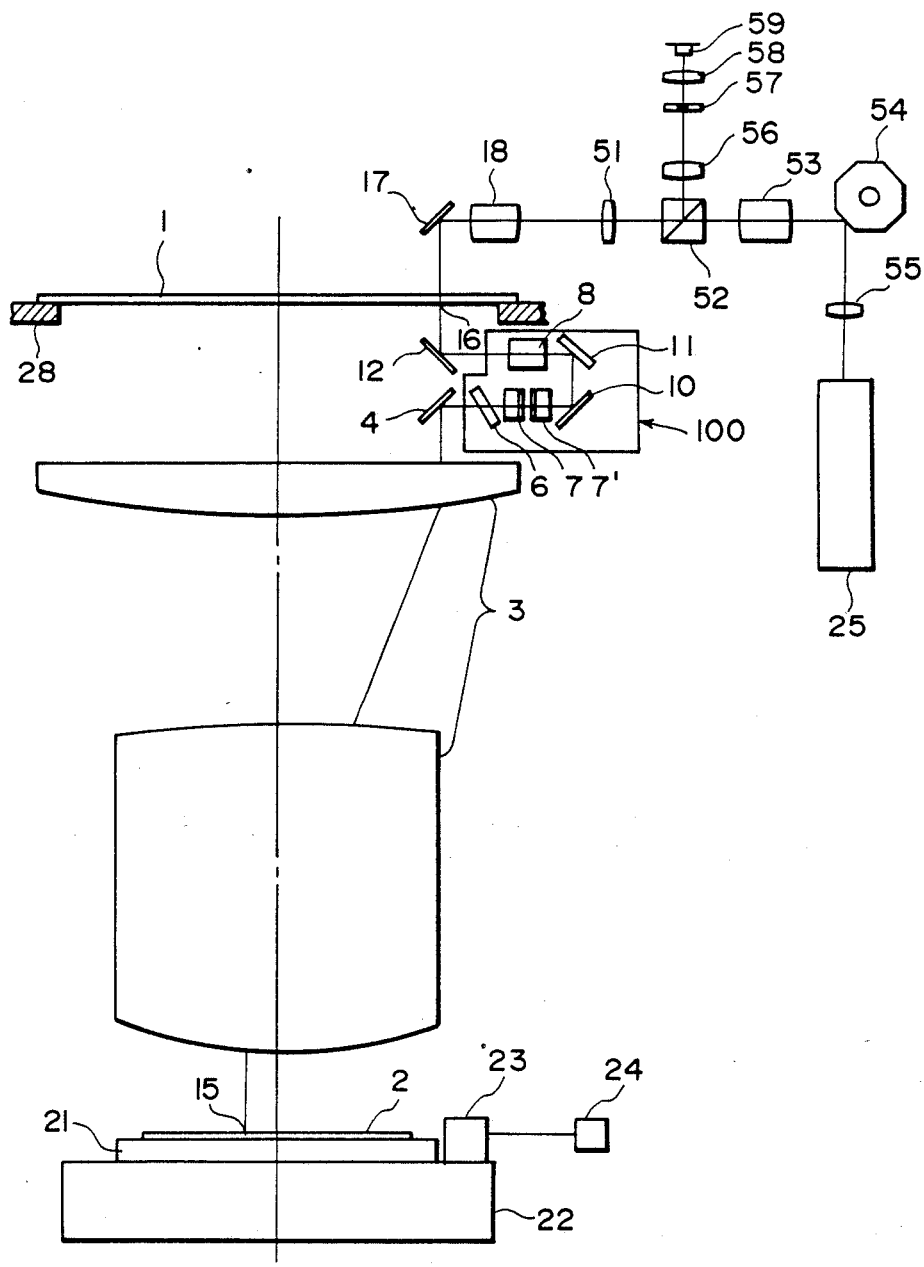
F I G. 6

OBSERVATION SYSTEM FOR A PROJECTION EXPOSURE APPARATUS

This application is a continuation, of application Ser. No. 253,895 filed Oct. 5, 1988, now abandoned, which is a continuation of Ser. No. 168,630, filed Feb. 23, 1988, now abandoned which is a continuation of Ser. No. 054,861, filed May 27, 1987, now abandoned.

FIELD OF THE INVENTION AND RELATED ART

This invention relates to an observation system suitably usable, for example, in the manufacture of microcircuits such as semiconductor integrated circuits and with a projection exposure apparatus having a projection optical system for optically projecting, upon a surface of a workpiece such as a semiconductor wafer, a fine pattern such as a microcircuit pattern formed on an original such as a mask or reticle. More particularly, the invention is concerned with an observation system suitably usable, e.g., with a projection exposure apparatus of the type described above, for observing a workpiece such as a wafer by use of light having a wavelength different from the light used for the pattern projection.

Observation systems are used in many optical instruments to observe the surface of an object upon which a pattern is to be or being projected by means of a projection optical system. For example, in the field of projection exposure apparatus for use in the manufacture of semiconductor devices such as integrated circuits, a projection optical system is provided to optically project an image of a mask or reticle (hereinafter simply "reticle") which is a first object, upon the surface of a wafer which is a second object. Also, an observation optical system is provided to observe the surface of the wafer. By the use of such an observation system, positional adjustment of the reticle and the wafer, called "alignment", is carried out. The accuracy of such alignment depends, to a greater degree, upon the optical performance of the observation system. For this reason, the performance of the observation system is one of most important factors in a projection exposure apparatus.

As for the reticle-to-wafer alignment using such observation systems, many proposals have been made. An example is disclosed in U.S. Pat. No. 4,528,082 assigned to the same assignee of the subject application. In an alignment and exposure apparatus according to the disclosure of this U.S. Patent, a projection optical system for projecting or photoprinting a circuit pattern of a reticle upon a wafer uses, for the pattern projection, light of g-line (436 nm in wavelength). On the other hand, an alignment system of the type usually called "TTL" (through-the-lens) system uses, for the reticle-to-wafer alignment, a laser beam emitted from a He-Cd laser and having a wavelength of 442 nm. Since these two wavelengths used are substantially equal to each other, substantially the same optical performance is attainable with respect to both of the two wavelengths even when the projection optical system is designed for the exclusive use with the g-line wavelength which is the wavelength used for the pattern projection.

For the better alignment accuracy in an alignment system of the TTL type which is arranged, such as the above-described alignment system, to detect the positional relation between the reticle and the wafer by use of the light passed through the projection optical system, it will be most desirable to use in the alignment system a wavelength which is exactly the same or substantially the same as the wavelength used for the projection exposure or "photoprinting". In this Specification, hereinafter, the wavelength when it is used for the alignment will be referred to also as "alignment wavelength", and the wavelength when it is used for the projection exposure will be referred to also as "photoprinting wavelength".

Use of the same or substantially the same wavelength for the projection exposure and for the alignment however involves inconveniences. Namely, in a case where a multilayer resist coating is provided on the wafer, the multilayer resist coating material which is absorbent to the photoprinting wavelength is liable to absorb the light irradiating the wafer for the alignment purpose. As a result, the quantity of light reflected from alignment marks formed on the wafer is reduced. Consequently, the signal-to-noise ratio of mark detecting signals is decreased with the result that the alignment accuracy is degraded. In consideration of this, it will be necessary to use an alignment wavelength which is significantly different from the photoprinting wavelength in order to improve the signal-to-noise ratio to thereby improve the alignment accuracy.

However, use of an alignment wavelength different from the photoprinting wavelength in a TTL alignment system encounters another problem. Namely, the projection optical system used in projection exposure apparatuses is usually designed so that various aberrations are satisfactorily corrected only with respect to the photoprinting wavelength to be used. Therefore, for the light other than the photoprinting wavelength, there occurs in the projection optical system chromatic aberration which hinders observation of the wafer alignment mark. Accordingly, it is not easy to obtain high alignment accuracy.

In an attempt to avoiding such problem caused by the chromatic aberration to thereby allow observation of the wafer by way of the projection optical system and by the use of light of a wavelength different from the photoprinting wavelength, many proposals have been made. According to one proposal, for allowing the observation of the surface of a wafer from above a reticle, the position of the wafer surface is shifted in the direction of an optical axis of the projection optical system by an amount corresponding to the amount of shift of focus of the projection optical system, caused by the chromatic aberration with respect to the wavelength used for the observation. This is done to retain an exact optically conjugate relation between the wafer surface and the reticle surface. However, the compensation for such chromatic aberration according to this proposal is not satisfactory, as will be described later in detail.

Another proposal has been made in U.S. Pat. No. 4,492,459 assigned to the same assignee of the subject application. The TTL alignment system disclosed in this U.S. Patent is of the TTL type and is provided with auxiliary optical means to correct the chromatic aberration caused by a projection optical system with respect to an alignment wavelength different from a photoprinting wavelength. However, the correction of the chromatic aberration according to this proposal is still insufficient, as will be described later in detail.

SUMMARY OF THE INVENTION

It is accordingly a primary object of the present invention to provide an improved observation system which is suitable for use with a projection optical system for optically projecting a first member upon a second member by use of a light and which is adapted to observe the second member by way of the projection optical system and by use of a light which is different in wavelength from the light used for the projection. Thus, chromatic aberration caused by the projection optical system with respect to the light used for the observation is satisfactory and sufficiently corrected, thus allowing exact observation of the second object.

It is another object of the present invention to provide an improved observation system which is particularly suitable for use with a semiconductor device manufacturing projection exposure apparatus and which is arranged to conduct TTL alignment by use of a wavelength different from that used for the projection. Thus, wherein chromatic aberration caused by a projection optical system with respect to the wavelength used for the alignment is satisfactorily and sufficiently corrected, thus allowing high-accuracy alignment.

In accordance with one aspect of the present invention, to achieve these objects, there is provided an observation system, usable with a projection optical system optically projecting a first member upon a second member by use of light of a first wavelength, for observing the second member by way of the projection optical system and by use of light of a second wavelength significantly different from the first wavelength. The observation system includes an observation optical system having at least one parallel-surface plate disposed inclinedly with respect to an optical axis of the observation optical system so as to correct "coma" caused by the projection optical system with respect to the second wavelength.

The observation optical system may comprise a lens system in addition to the parallel-surface plate. As for such lens system, a cylindrical lens, a spherical lens or an aspherical lens may be used. The cylindrical lens is used to suitably correct "astigmatism" caused by the projection optical system with respect to the second wavelength. Also, the aspherical lens is used to suitably correct "spherical aberration" caused by the projection optical system with respect to the second wavelength.

As for the aspherical lens, a lens element made by forming, into an aspherical shape, a spherical surface of an ordinary spherical lens. Alternatively, an optical element whose surface has been made into an aspherical shape, by forming a curved-surface portion in the surface of a parallel-surface plate or the like, may be used.

In accordance with another aspect of the present invention, there is provided an observation system, usable with a projection optical system for optically projecting a first member upon a second member by use of light of a first wavelength, for observing the second member by way of the projection optical system and by use of light of a second wavelength significantly different from the first wavelength, wherein the observation system includes an observation optical system having a plurality of parallel-surface plates disposed inclinedly with respect to an optical axis of the observation optical system and wherein one of the parallel-surface plates is inclined in a meridional plane of the projection optical system while, on the other hand, two parallel- c surface plates are inclined in a plane orthogonal to the meridional plane. By the combination of these parallel-surface plates, "coma" and "astigmatism" caused by the projection optical system with respect to the second wavelength are satisfactorily and sufficiently corrected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a fragmentary and perspective view schematically showing an observation system according to another embodiment of the present invention, when the observation system is incorporated into a projection exposure apparatus of the type shown in FIG. 1A.

FIG. 4 is a fragmentary and enlarged perspective view showing a light detecting portion of the observation system of the FIG. 3 embodiment.

FIG. 5 is a schematic view of an optical arrangement of a semiconductor device manufacturing projection exposure apparatus into which an observation system according to a still further embodiment of the present invention is incorporated.

FIG. 6 is a view similar to FIG. 5, but shows a yet another embodiment of the present invention.

DESCRIPTION OF THE PREFERRED EMBODIMENTS

Figure 1A:
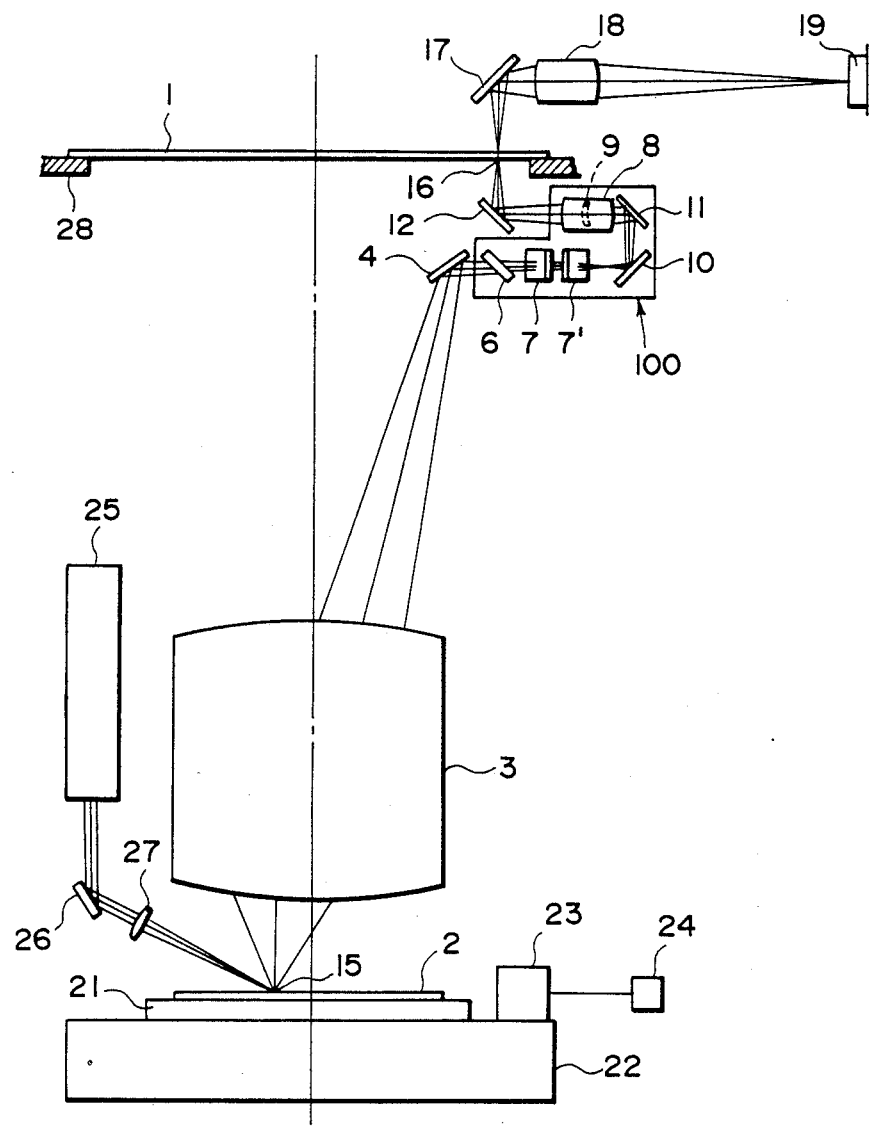
FIG. 1A is a schematic view of an optical arrangement of a semiconductor device manufacturing projection exposure apparatus into which an observation system according to one embodiment of the present invention is incorporated.

Referring first to FIG. 1A, there is shown a semiconductor device manufacturing exposure apparatus into which an embodiment of the present invention is incorporated.

In FIG. 1A, a reticle 1 which is an original (first object) having a circuit pattern formed on its lower surface, is placed on a reticle stage 28. A projection optical system 3, which comprises a lens optical system, is adapted to optically project the circuit pattern of the reticle 1 upon the surface of a wafer 2 which is a workpiece (second object), so that the pattern of the reticle 1 is photoprinted on the wafer 2.

Denoted at 21 is a $\theta$-Z stage that carries thereon the wafer 2. The $\theta$-Z stage 21 is arranged to adjust the rotational position ($\theta$-position) of the wafer 2 and also to execute the focus adjustment, i.e. the adjustment of the position of the wafer 2 in the Z-direction, in cooperation with an automatic focusing system (not shown). The θ-Z stage 21 is mounted on an X-Y stage 22 which is adapted to step-feed the wafer 2 at a high precision. Mounted also on the X-Y stage 22 is an optical square 23 which provides a "reference" for the measurement of the position of the X-Y stage 22. The position of the optical square 23 is monitored by a laser interferometer unit 24. Denoted at 25 is a laser which is, in this embodiment, a He-Ne laser. The laser beam from the laser 25 is directed, by way of a mirror 26 and a lens 27, to the wafer 2 surface so as to irradiate, with the laser beam, an alignment mark 15 formed on the wafer 2.

Denoted at 4 is a mirror which is disposed so as to receive the laser beam reflected from the wafer alignment mark 15 and passed through the projection optical system 3. Denoted generally at 100 is an optical system which constitutes a portion of an observation optical system. Hereinafter, the optical system 100 will be referred to as "optical unit". The optical unit 100 is disposed so as to receive the laser beam reflected from the mirror 4, and includes a plurality of parallel-surface plates (three in this embodiment) 6, 7 and 7'. These parallel-surface plates are illustrated in a side view in FIG. 1A, while they are illustrated in a top plan view in FIG. 1B. As will be understood from these Figures, the parallel-surface plate 6 is disposed inclinedly in a meridional section (the plane containing the sheet of FIG. 1A). On the other hand, the parallel-surface plates 7 and 7' are disposed inclinedly in a plane orthogonal to the plan in which the parallel-surface plate 6 is inclined. In other words, the parallel-surface plates 7 and 7' are inclined, in opposite directions, in a plane perpendicular to the sheet of FIG. 1A so that they are at positions rotated or twisted, about the optical axis of the optical unit 100, relative to the parallel-surface plate 6 by 90 degrees and in opposite directions.

The observation system further includes mirrors 10, 11 and 12, and a relay lens system 8. Reference numeral 16 denotes a position on the reticle 1, upon which position an image of the wafer alignment mark 15 is formed by the cooperation of the projection optical system 3 and the optical unit 100. At this position or in the neighborhood thereof, an alignment mark is provided on the reticle 1. The observation system further includes a mirror 17, an alignment scope 18 and an image pickup device which comprises, in this embodiment, a charge-coupled device assembly. Hereinafter, the image pickup device 19 will be referred to as "CCD image sensor". In this embodiment, the reticle 1 and the wafer 2, more particularly the reticle alignment mark and the wafer alignment mark, are observed by use of output signals from the CCD image sensor.

The projection exposure apparatus of the present embodiment is arranged so that the circuit pattern of the reticle 1 is projected upon the wafer 2 surface by means of the projection optical system 3 and by use of a particular light, e.g. g-line rays (436 nm in wavelength), supplied from an illumination optical system (not shown). On the other hand, for the reticle-to-wafer alignment, the alignment mark 15 of the wafer 2 is irradiated with the light from the He-Ne laser 25 having a wavelength 633 nm which is significantly different from the photoprinting wavelength (436 nm). Thus, by use of the light of 633 nm in wavelength and by the cooperation of the projection optical system 3 and the optical unit 100, an image of the wafer alignment mark 15 is formed in the neighborhood of the reticle alignment mark. This allows simultaneous observation, by use of the alignment scope 18, the reticle alignment mark and (the image of) the wafer alignment mark. At least a portion of the optical unit 100 may be made movable, if desired, so as to meet the change in the image height of the wafer alignment mark (i.e. the distance, from the optical axis of the projection optical system, of the image of the wafer alignment mark to be formed on the reticle 1 surface). Also, the mirror 4 and the like may be made movable, if necessary, so as to be retracted out of the path of the light for the pattern projection.

Usually, a projection optical system of a projection exposure apparatus is designed so that various aberrations are corrected exclusively with respect to a light of a definite wavelength to be used for the pattern projection (photoprinting). This means that the aberration-correction is generally insufficient with respect to wavelengths significantly different from that used for the photoprinting. Accordingly, in a case where a light of a wavelength which is significantly different from the wavelength used for the pattern projection is used for the observation of a wafer alignment mark by way of the projection optical system, as in the case of the present embodiment, there occurs chromatic aberration as a consequence of the difference in wavelength. As for such chromatic aberration, there are two types, "longitudinal or axial chromatic aberration" and "chromatic aberration of magnification". Additionally, there occur "coma", "astigmatism", "spherical aberration" and so on, all of which are caused in relation to the use of a wavelength different from the photoprinting wavelength, that is in relation to the "chromaticity".

When the surface of a wafer is regarded as an object plane with respect to a projection optical system, the image of a wafer alignment mark being projected by the projection optical system is formed, in many cases, at a position above a reticle due to the chromatic aberrations described above. For example, where the projection optical system has a projection magnification of 1/5 and the magnitude of the axial chromatic aberration on the wafer side is about 300 microns, then the image of the wafer, i.e. the image of the wafer alignment mark, will be formed at a distance $0.3 \times 5^2 = 7.5$ (mm) above the reticle.

The formation of the image of the wafer alignment mark "above" the reticle is because the wavelength used for the observation is longer than that used for the photoprinting. If this relation is inverted, the wafer alignment mark will be imaged below the reticle.

Such shift of the imaging position as described above is chiefly because of the axial chromatic aberration. However, in addition to the shift of the imaging position, the image of the wafer alignment mark being projected by the projection optical system is extraordinarily blurred, due to other "chromatic" aberrations such as "astigmatism", "coma", "spherical aberration", etc.

As described in the introductory part of this Specification, the aforementioned U.S. Pat. No. 4,492,459 shows use of an auxiliary optical means in an alignment system, more particularly, between a reticle and a projection lens system. As for such auxiliary optical means, a single lens or a parallel-surface plate is used. However, the auxiliary optical means in this patent is provided solely to correct the shift of the focus position due to a particular one of the chromatic aberrations and, in some case, to correct the displacement of an image in an image plane. The shift of the focus position is an error that is caused by the "axial chromatic aberration" which is merely one of various aberrations to be caused in relation to the use of the "different wavelength". Thus the proposed auxiliary optical means is not used to correct "astigmatism" or other asymmetrical aberrations such as "coma" an "chromatic aberration of magnification". In place thereof, the proposed alignment system conducts the observation by utilizing only information relating to image formation with respect to the sagittal direction, with the use of an alignment mark formed by a rectilinear pattern or patterns extending substantially radially outwardly from the optical axis of the projection optical system. This is because substantially no asymmetrical aberration occurs in image formation with respect to the sagittal direction.

The observation of the alignment mark by use of image formation only with respect to the sagittal direction, however, will be difficult to assure much higher alignment accuracy that meets the requirements of much higher resolution of the order of a sub-micron linewidth. As an example, any error in the imaging characteristics of the projection optical system itself such as, e.g., an error in the projection magnification resulting from a change in an ambient pressure, can be considered as an equivalent of a magnification change. Also, any local deformation of a wafer can be considered as such equivalent of the magnification change. With the mark observation by use of only information relating to the image formation with respect to the sagittal direction and by use of the radially outwardly extending alignment mark pattern, however, it is quite difficult to detect such errors that can be regarded as an equivalent of the magnification change.

Further, with image formation only in the sagittal direction, basically the observation with respect to a single point on the wafer merely allows detection of one-dimensional positional-information. This is insufficient to achieve two-dimensional alignment.

In addition to the above-described inconveniences, the abandonment of correction of "astigmatism" and other asymmetrical aberrations such as "coma" and "chromatic aberration of magnification" is not desirable because these aberrations prohibit exact observation of the wafer alignment mark. The magnitude of those aberrations increases with the increase in the difference between the wavelength used for the observation and the wavelength used for the photoprinting. For example, where g-line rays are used for the photoprinting while a light of 633 nm in wavelength is used for the observation, then the magnitude of these aberrations often becomes not less than several-times larger than the wavelength (λ) when expressed in terms of the wavefront aberration.

The present invention has been achieved on the basis of these findings, made by the inventors of the subject application, and thus aims at providing an observation system which is effective to almost completely correct the chromatic aberrations described hereinbefore to thereby avoid their associated inconveniences and thereby to ensure exact observation of the wafer alignment mark when the observation system is incorporated into a semiconductor device manufacturing exposure apparatus.

As a solution for the problem considered in the foregoing, the present invention uses in one aspect thereof one or more parallel-surface plates to correct "coma" and/or "astigmatism" described hereinbefore.

Referring back to FIG. 1A, the first embodiment of the present invention will be described in more detail.

Briefly, in the first embodiment, a specifically arranged optical unit (which is the optical unit 100) is provided between the reticle 1 and the projection optical system 3. This optical unit 100 is effective to satisfactorily correct various aberrations, particularly the aberrations concerned with "chromaticity", not only in the sagittal direction but also in the meridional direction. This is made to allow that, upon observation, a sharp image of the wafer pattern (wafer alignment mark) is formed exactly on the reticle 1 surface, thereby to assure exact observation of the wafer alignment mark as well as the reticle alignment mark. By this, a highly accurate alignment of the reticle 1 and the wafer 2 is ensured.

More specifically, in the observation optical system of the present embodiment, three parallel-surface plates are provided in the optical unit 100 and they are disposed in the manner described hereinbefore so as to correct various aberrations caused by the projection optical system 3 in relation to the wavelength of light used for the observation, i.e. the alignment wavelength. Particularly, in this embodiment, these three parallel-surface plates are used to correct the "coma" and the "astigmatism".

Specifically, of these three parallel-surface plates, the first parallel-surface plate 6 is disposed inclinedly relative to the meridional section of the projection optical system 3, i.e. disposed inclinedly relative to the image-forming light flux in the meridional section, so as to correct the "coma" caused by the projection optical system 3 with respect to the observation wavelength. At this time, the angle of inclination of the parallel-surface plate 6 is determined in accordance with the magnitude of aberration and the thickness of the parallel-surface plate 6.

Figure 1B:
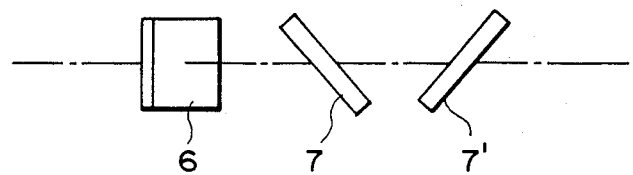
FIG. 1B is a top plan view of a parallel surface plate assembly included in the observation system of the FIG. 1A embodiment.

While the use of a single parallel-surface plate such as the plate 6 is effective in respect to the correction of "coma", it disadvantageously leads to generation of "astigmatism". The sum of such astigmatism and the astigmatism of the projection optical system 3 with respect to the observation wavelength is the total astigmatism which appears upon observation. To avoid such inconvenience, the present embodiment uses two additional parallel-surface plates such as the plates 7 and 7'. As described hereinbefore, these parallel-surface plates 7 and 7' are inclined in opposite directions, in a plane perpendicular to the plane in which the parallel-surface plate 6 is inclined. This arrangement is adopted so as specifically to produce such "astigmatism" that is effective to cancel the astigmatism caused by the projection optical system 3 and the parallel-surface plate 6. By this, the "total astigmatism" described above is adequately corrected.

Where the parallel-surface plates 7 and 7' have the same thickness, they may be disposed or inclined symmetrically as best seen in FIG. 1B. If they have different thickness, they may be inclined at different angles. It is to be noted that these two parallel-surface plates 7 and 7' are disposed so as not to produce, in the combination, aberration resulting from "coma".

In a case where the projection optical system 3 used does not show "astigmatism", while it shows "coma", each of the two parallel-surface plates 7 and 7' may have a thickness which is substantially a half of the thickness of the parallel-surface plate 6. Also, in such case, all the three parallel-surface plates 6, 7 and 7', may preferably be disposed so that they have substantially the same angle (inclination angle) with respect to the optical axis of the observation optical system (although the plates 7 and 7' may be "twisted" relative to the plate 6). This arrangement is effective to correct the coma of the projection optical system 3 as well as the astigmatism caused by the parallel-surface plate 6.

In the present embodiment, the angle of inclination of each of the parallel-surface plates 6, 7 and 7' is made adjustable. This is very effective because, where the projection optical system 3 used shows astigmatism with respect to the observation wavelength, precise and exact correction of the aberration is attainable by adjusting the angle defined between the first parallel-surface plate 6 and the remaining parallel-surface plates 7 and 7' in accordance with the magnitude of the astigmatism of the projection optical system 3. Namely, in the present embodiment, the amount of aberration-correction can be controlled as desired, by adjusting the inclination of one or more parallel-surface plates.

With the structure of the present embodiment as has been described in the foregoing, the "coma" (which appears as the asymmetry in the meridional direction) and the "astigmatism" (which appears as the difference in the imaging position in the sagittal and meridional surfaces) can be corrected satisfactorily. Thus, not only in the sagittal direction but also in the meridional direction, sufficient and satisfactory aberration-correction is attained. As a consequence, exact and simultaneous observation of the alignment marks of the reticle 1 and the wafer 2 is allowed, with the result that much higher alignment accuracy is attained.

As illustrated in FIG. 1, the light to be projected upon the wafer 2 for the observation of its alignment mark is supplied from the laser 25 which is outside the projection optical system 3. Namely, the laser beam from the laser 25 is inclinedly projected upon the wafer alignment mark 15 by means of the mirror and the lens 27. From this, it is seen that the alignment system of the FIG. 1A apparatus is constructed so that scattered light rays from the wafer alignment mark 15 are to be detected.

Figure 7A:
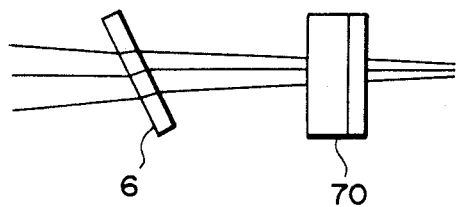
FIG. 7A is a fragmentary side view showing the cooperative arrangement of a parallel-surface plate and a cylindrical lens which may be included in the observation system of the present invention.
Figure 7B:
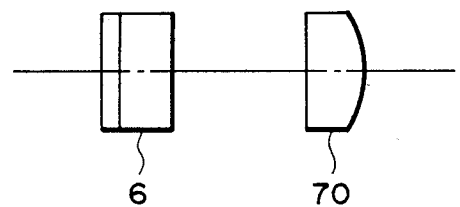
FIG. 7B is a top plan view of the parallel-surface plate and the cylindrical lens shown in FIG. 7A.

While, in the embodiment of FIG. 1A, the three parallel-surface plates 6, 7 and 7' provided in the optical unit 100 are contributable to the correction of the astigmatism and the coma, they may be replaced by a combination of a single parallel-surface plate 6 and a cylindrical lens 70, as illustrated in FIGS. 7A and 7B. The combination of these two optical elements is also effectively contributable to the correction of the astigmatism and the coma. Of these Figures, FIG. 7A is a side view, and FIG. 7B is a top plan view. As is best seen in FIG. 7B, the cylindrical lens 70 has a generating line that extends in a direction perpendicular to the optical axis of the optical unit 100 (FIG. 1A) and perpendicular to the sheet of FIG. 7B. The parallel-surface plate 6 is inclined relative to the optical axis as best seen in FIG. 7A. With this arrangement, the parallel-surface plate 6 is effective to correct the coma which is caused by the projection optical system 3 with respect to the observation wavelength. On the other hand, the cylindrical lens 70 is effective to correct the astigmatism which is caused by the projection optical system 3 and the parallel-surface plate 6. The cylindrical lens 70 may be disposed at or in the neighborhood of a position which is optically conjugate with the pupil of the projection optical system 3. Reference numeral 9 in FIG. 1A denotes such position, as will be described later.

It is to be noted that the configuration and the position of the cylindrical lens 70 should be determined in accordance with the state and/or the magnitude of the total astigmatism caused by the projection optical system 3 and the parallel-surface plate 6. Therefore, depending on these factors, it may be possible to dispose the cylindrical lens 70 so that its generating line extends in a direction perpendicular to the sheet of FIG. 7A.

Referring back to FIG. 1A, description will be made to the correction of the spherical aberration.

In a case where there remains a small amount of spherical aberration, the lens system 8 of the optical unit 100 may arranged to correct the same. Namely, if the projection optical system 3 used shows a small amount of spherical aberration with respect to the observation wavelength, the lens system 8 is arranged to produce such spherical aberration that is effective to cancel the spherical aberration of the projection optical system 3. When, on the other hand, there remains a large amount of spherical aberration (e.g. an amount several-times greater than the wavelength) and if the lens system 8 is at a position nearer to the reticle 1 and has a relatively small numerical aperture (NA) of an order not more than 0.1, for example, then an aspherical optical element 9 may preferably be provided at a position which is within the lens system 8 and which is substantially optically conjugate with the position of a pupil of the projection optical system 3. By doing so, satisfactory correction of the spherical aberration is attainable, regardless of the variation in the image height. For example, where the spherical aberration is "under", the aspherical optical member 9 may have an aspherical surface shaped so that a negative refracting power increases, in the negative direction, toward an outer periphery thereof.

As for such aspherical member, an ordinary aspherical lens element or an optical element made by forming an aspherical surface in a light-transmitting surface of a parallel-surface plate, may be used.

As regards the shape of the aspherical surface providing an "increasing" negative refracting power, an aspherical surface when it is provided by a convex surface may have a shape having a decreasing curvature which decreases toward the outer periphery. If, on the other hand, the aspherical surface is provided by a concave surface, it may have a shape having an increasing curvature which increases toward the outer periphery.

With regard to the axial chromatic aberration (causing the shift of focus) and the curvature of field, it will be readily understood that they can be corrected by the adjustment of the optical arrangement of the observation optical system, because the focus is adjustable by adjusting the optical path length of the observation optical system. Also, with regard to the position of the image, any shift or deviation thereof can be compensated for if the amount of shift or deviation is predetected. That is, the "distortion" and the "chromatic aberration of magnification" (which appears as the image shift), caused in relation to the chromaticity, can be easily compensated for by calculations in an electrical processing unit, not shown, as an "offset processing".

Namely, in the present embodiment, any shift of focus can be easily adjusted and, additionally, any shift of image can be easily compensated for by the "offset processing". Accordingly, what is the important problem to be considered upon the detection of the alignment mark is the error caused by the astigmatism, the coma and the spherical aberration resulting in deteriorated contrast of the image of the alignment mark. In the projection optical system, these aberrations are not satisfactorily corrected with respect to the observation wavelength, although they are sufficiently corrected with respect to the photoprinting wavelength. However, as a result of the inventors' analysis, it has been found that the manner of occurrence of these aberrations with respect to the observation wavelength can be treated in the field of the basic three-order aberration theory, merely as a simple error in the aberration-correction with respect to the photoprinting wavelength. This is the reason why a particular arrangement of the optical components of the optical unit 100 can be specified or determined in relation to a particular projection optical system used. In the present embodiment, for example, the three parallel-surface plates 6, 7 and 7' are disposed in a manner described hereinbefore, whereby the aberrations are corrected satisfactorily. Thus, an observation system capable of precisely and exactly observing the wafer alignment mark as well as the reticle alignment mark, is accomplished.

Of course, the chromatic aberration of magnification and/or the distortion may be corrected by use of other suitable optical means, as desired, in place of the offset processing.

If desired, the lens system 8 of the present embodiment, having a function of forming the image of the wafer alignment mark upon the surface of the reticle 1, may be fabricated so as to have, additionally, an adjusting function contributable to project the image of the wafer upon the reticle 1 surface exactly at a desired magnification. For example, when a projection optical system having a magnification of 5× is used, it is possible to adjust the lens system 8 so as to assure the exact magnification 5×. In this case, the lens system 8 itself has an imaging magnification −1×. This facilitates the offset processing to be made later. Of course, the lens system 8 may be modified so as to have an imaging magnification of 1×, and such lens system may suitably be applicable to the present embodiment.

In summary, according to the FIG. 1A embodiment of the present invention, the coma, the astigmatism and the spherical aberration (of various aberrations chiefly caused by the projection optical system 3 in relation to the chromaticity) are corrected in the observation optical system. Also, the focus error and the shift of image plane is corrected by adjusting the optical path length. Further, the chromatic aberration of magnification and the distortion are compensated for by the offset processing. In this manner, these aberrations are totally corrected.

Particularly, in the optical unit 100 of the FIG. 1A embodiment, the coma and the astigmatism are corrected by means of parallel-surface plates. Use of such parallel-surface plates is very advantageous because it allows reduction in size of the optical arrangement and the simplification of the optical design of the observation system. Further, simple adjustment of the inclination of the parallel-surface plates relative to the optical axis allows creation of "coma" and "astigmatism" of desired amounts. Therefore, only by changing the degree of inclination, suitable aberration-correction is attainable in accordance with the magnitude of the coma and/or the astigmatism caused by the projection optical system. This is a noteworthy advantage because, if one or more lens elements comprising spherical and/or aspherical lens elements are used for this purpose, they have to be replaced by other optical components when the magnitude of the aberration of the projection optical system is changed.

Use of a cylindrical lens element for the correction of astigmatism, such as the embodiment described with reference to FIGS. 7A and 7B, is desirable in the point that a single optical element can correct the astigmatism without adversely affecting the correction of the other aberrations.

As described hereinbefore, the aberration-correction in the present embodiment is conducted not only with respect to the sagittal direction but also with respect to the meridional direction. For this reason, with the observation system of the present embodiment, only the observation of an alignment mark formed at a single point on the wafer 2 surface does assure detection of two positional signals with respect to two orthogonal X-Y directions. In order to complete more exact two-dimensional alignment, the observation may preferably be effected with respect to at least two points on the wafer (and the reticle) so as to adjust the relative position of the wafer in the $\theta$ (rotational) direction. While such a plural-point observation is attainable by use of a single observation system, it can preferably be achieved by use of two observation optical systems, such as shown in FIG. 2. In the apparatus of FIG. 2, each observation optical system has a similar structure as the FIG. 1A embodiment. By the plural-point observation through the alignment scopes 18—18, the position adjustment in the X, Y and $\theta$ directions is attainable without decreasing the throughput of the apparatus. In FIG. 2, like numerals as of the FIG. 1A embodiment are assigned to similar or corresponding elements.

Referring back to FIG. 1A, usually a wafer such as at 2 has one or more alignment marks in association with each of plural shot areas defined on the wafer. In the embodiment of FIG. 1A, each wafer alignment mark is observed by the observation system when it is at a position as denoted by numeral 15. After completion of the measurement of the degree of alignment between the reticle 1 and the wafer 2, the wafer 1 is displaced by means of the X-Y stage 22 in accordance with the result of measurement and with the aid of the laser interferometer system 24 monitoring the movement of the X-Y stage 22.

For the complete two-dimensional alignment, two-point measurement is desirable. In consideration thereof, the X-Y stage 22 of the FIG. 1A embodiment is moved so that two measuring points on the wafer 2 is moved to the observing position (at 15) in sequence. After the measurement, the X-Y stage 22 is moved so as to move the wafer 2 (more particularly, a particular shot area which is just going to be exposed to the reticle pattern) to the exposure position (photoprinting position), in accordance with the result of measurement. For such dual measurements, two alignment scopes shown in FIG. 2 may of course be used. Alternatively, a single alignment scope may be used to observe two points on the wafer in sequence, with the aid of feeding by the X-Y stage.

From the two-point measurement, it is possible to detect any change in the magnification. An example of the manner of magnification detection is disclosed in U.S. Pat. No. 4,538,914. Thus, if desired, any magnification error of the projection optical system 3 may be corrected by suitable means such as disclosed in this U.S. Patent.

For the observation of the wafer alignment mark, the X-Y stage 22 may be moved continuously. It is not always necessary to tempolarily stop the movement of the X-Y stage for the observation. Further, if it is not necessary to correct the θ-error with respect to each shot area, only one alignment scope may be used for the single-point observation.

Referring now to FIGS. 3-6, description will be made of further embodiments of the present invention, all of which are incorporated into semiconductor device manufacturing projection exposure apparatuses. In these Figures, like numerals as of the FIG. 1A embodiment are assigned to similar or corresponding elements.

Figure 3:
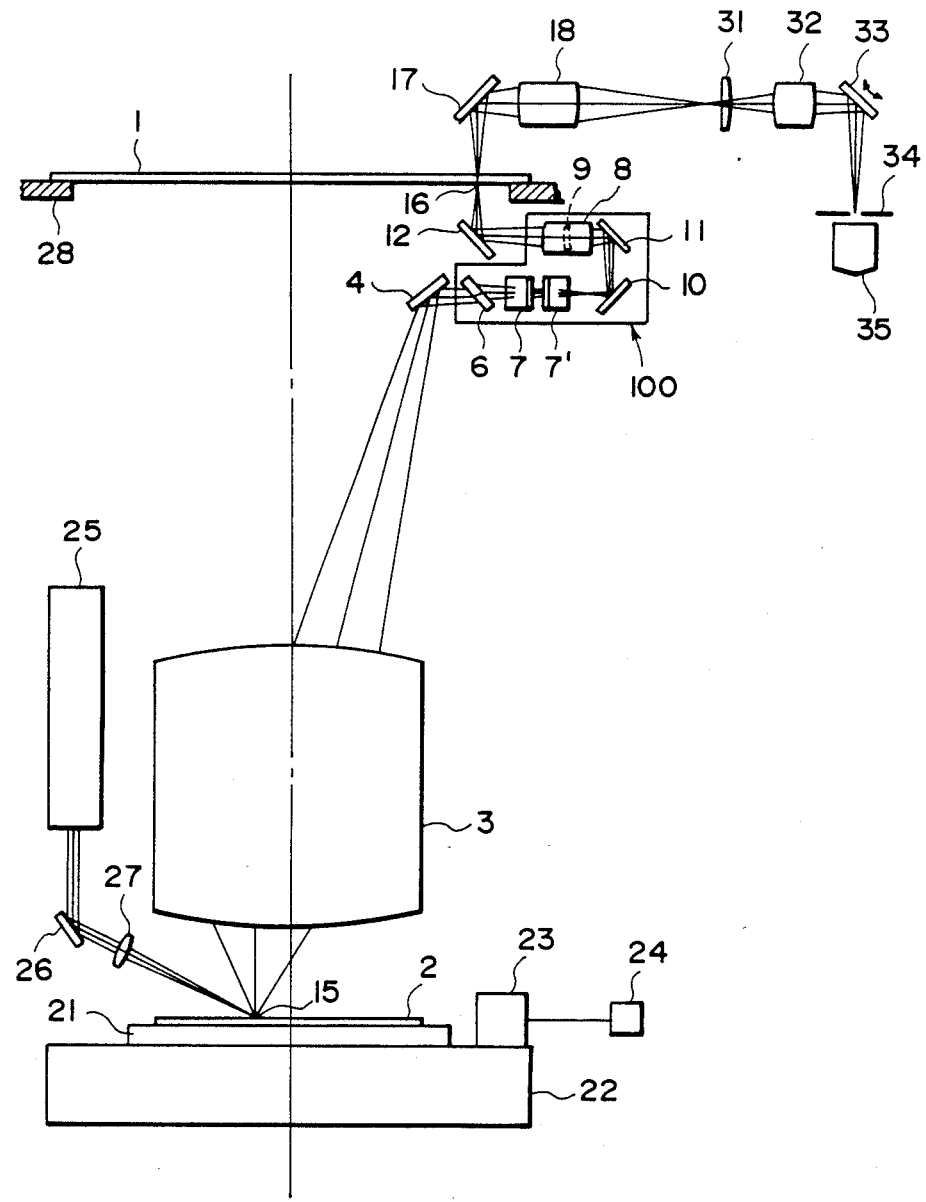
FIG. 3 is a schematic view of an optical arrangement of a semiconductor device manufacturing projection exposure apparatus into which an observation system according to a further embodiment of the present invention is incorporated.

In the apparatus of the FIG. 3 embodiment, the structure provided below the reticle 1 is the same as the corresponding portion of the apparatus of the FIG. 1A embodiment. In the FIG. 3 embodiment, for the observation of the alignment mark 16 provided on the reticle 1 surface, a combination of a galvano mirror 33, a slit member 34 and a photomultiplier 35 is used in place of the CCD image sensor used in the FIG. 1A embodiment. More specifically, the galvano mirror 33 is used to scanningly deflect the light from the alignment scope 18 so that the image of the alignment mark is relatively scanned by a slit formed in the slit member 34. The light passed through the slit member 34 is received by the photomultiplier 35. More exactly, a field lens 31 is disposed adjacent to an imaging plane on which an image of the reticle alignment mark 16 is to be formed by the alignment scope 18. By this field lens 31 and by way of an erector 32, the imaging light from the alignment scope 18 is directed to the galvano mirror 33, whereby it is scanningly deflected. Thus, the image of the reticle alignment mark is relatively scanned by the slit 34. In this embodiment, the galvano mirror 33 is disposed so that its reflection point is substantially coincident with a position which is optically equivalent to the position of the pupil of the projection optical system 3.

As for the scanning means, a polygonal mirror may be used in place of the galvano mirror. Since the scan is made one-dimensionally, the slit member 34 may preferably have two slit apertures inclined with +45 degrees and −45 degrees, respectively, such as illustrated in FIG. 4. Also, two photomultipliers 35 may be provided. In such case, the alignment mark may comprise two rectilinear patterns extending similarly, i.e. inclined at the angles of ±45 degrees, respectively. By doing so, one-dimensional scan is effective to detect or obtain positional information with respect to the X and Y directions.

FIG. 5 shows an embodiment wherein the observation optical system, arranged to correct various chromatic aberrations caused by the projection optical system 3 with respect to the alignment wavelength, is disposed on the alignment scope 18 side, i.e. above the reticle 1. In this case, upon observation of the reticle alignment mark 16 by the alignment scope 18, the image of the wafer alignment mark 15 is formed, due to the chromatic aberrations, at a position which is on the alignment scope 18 side of the reticle 1 (reticle alignment mark 16). The interval between the imaging position and the reticle 1 surface is so large (e.g. 7.5 mm) that cannot be covered by the depth of focus of an objective lens of the alignment scope 18. In consideration of this, the present embodiment uses a dual-focus system wherein the light beam from the alignment scope 18 is divided into two by a beam splitter 41 and the divided light beams are combined by another beam splitter 43. In an optical path which is defined by the beam splitter 41 for the light that passes through the beam splitter 41, a relay lens 42 is disposed. By this relay lens 42, an image of the reticle alignment mark 16 is formed on the CCD image sensor 19.

On the other hand, in an optical path defined by the beam splitter 41 for the light reflected by the beam splitter 41, an optical unit 100 corresponding to the optical unit of the FIG. 1A embodiment and comprising three parallel-surface plates 6, 7 and 7' and a relay lens 8, is disposed, so that the wafer alignment mark 15 is imaged by these optical elements upon the surface of the CCD image sensor 19.

Thus, the coma and the astigmatism as well as the spherical aberration are corrected in a similar manner as in the FIG. 1A embodiment.

With regard to the axial chromatic aberration and the curvature of field, they are corrected by adjusting the difference in the optical path length of the dual-focus system of the observation optical system. Also, any shift of imaging position due to the chromatic aberration of magnification and/or the distortion is compensated for by the offset processing in an unshown processing unit, on the basis of the amount of shift predetected. In this manner, the utput signals from the CCD image sensor is processed by the processing unit, whereby correct data concerning the observation is obtainable from the processing unit.

For the efficiency in the processing of the signals from the CCD image sensor 19, preferably the observation optical system has the same imaging magnification with respect to the two optical paths defined by the beam splitter 41.

FIG. 6 shows an embodiment in which the present invention is applied to an alignment system that uses laser beam scanning, of the type disclosed in U.S. Pat. Nos. 4,202,627 and 4,301,363 both assigned to the same assignee of the subject application.

The projection optical system 3 of the present embodiment is made telecentric both on the reticle 1 side and the wafer 2 side. A laser beam from a laser 25, which comprises in this embodiment a He-Ne laser, is passed through a lens 55 and is projected upon a polygonal mirror 54. By this polygonal mirror 54 and by an f-θ lens 53, the laser beam is scanningly deflected in a specific manner. The laser beam from the f-θ lens 54 passes through an alignment scope 18 and an optical unit 100 similar to the optical unit of the FIG. 1A embodiment, and thereafter it is incident upon a wafer 2. The light scatteringly reflected from an alignment mark 15 of the wafer 2 goes back to the alignment scope 18 and is reflected by a beam splitter 52. The light from the beam splitter 52 is passed through a lens 56, a spatial filter 57 and a condenser lens 58, whereby it is incident upon a photodetector 59.

Since the manner of alignment using the above-described structure is described in detail in the aforementioned U.S. Patents, description thereto will be omitted here for simplification.

In each of the embodiments described hereinbefore, at least a portion of the observation optical system may be made adjustable so as to meet the change in the position of the alignment mark corresponding to the change in size of the semiconductor chips. For example, with regard to the parallel-surface plates effective to correct the astigmatism and the coma, the amount of correction can be controlled as desired by changing the angle of inclination. With regard to the spherical aberration, the amount of change of the spherical aberration resulting from the change in image height is very small, so that it can be disregarded. Therefore, no specific adjustment will be necessary.

In the embodiments described hereinbefore, one or more of the three parallel-surface plates may be divided. That is, four or more parallel-surface plates may be used in the optical unit 100, with substantially the same advantageous effects.

As described in the foregoing, the present invention allows with the structure described hereinbefore satisfactory correction of various aberrations caused in a projection optical system in relation to the "chromaticity", at the time of observation by way of the projection optical system and by use of a wavelength different from that to be used for the pattern projection. As a result, by the present invention, an observation system capable of exactly observing an object is accomplished. Particularly, when the present invention is incorporated into semiconductor device manufacturing projection exposure apparatuses, a sharp image of a reticle surface and a sharp image of a wafer surface can be observed. Therefore, two-dimensional alignment of the reticle and the wafer in the X, Y and $\theta$ directions is attainable with much higher accuracy.

Figure 8:
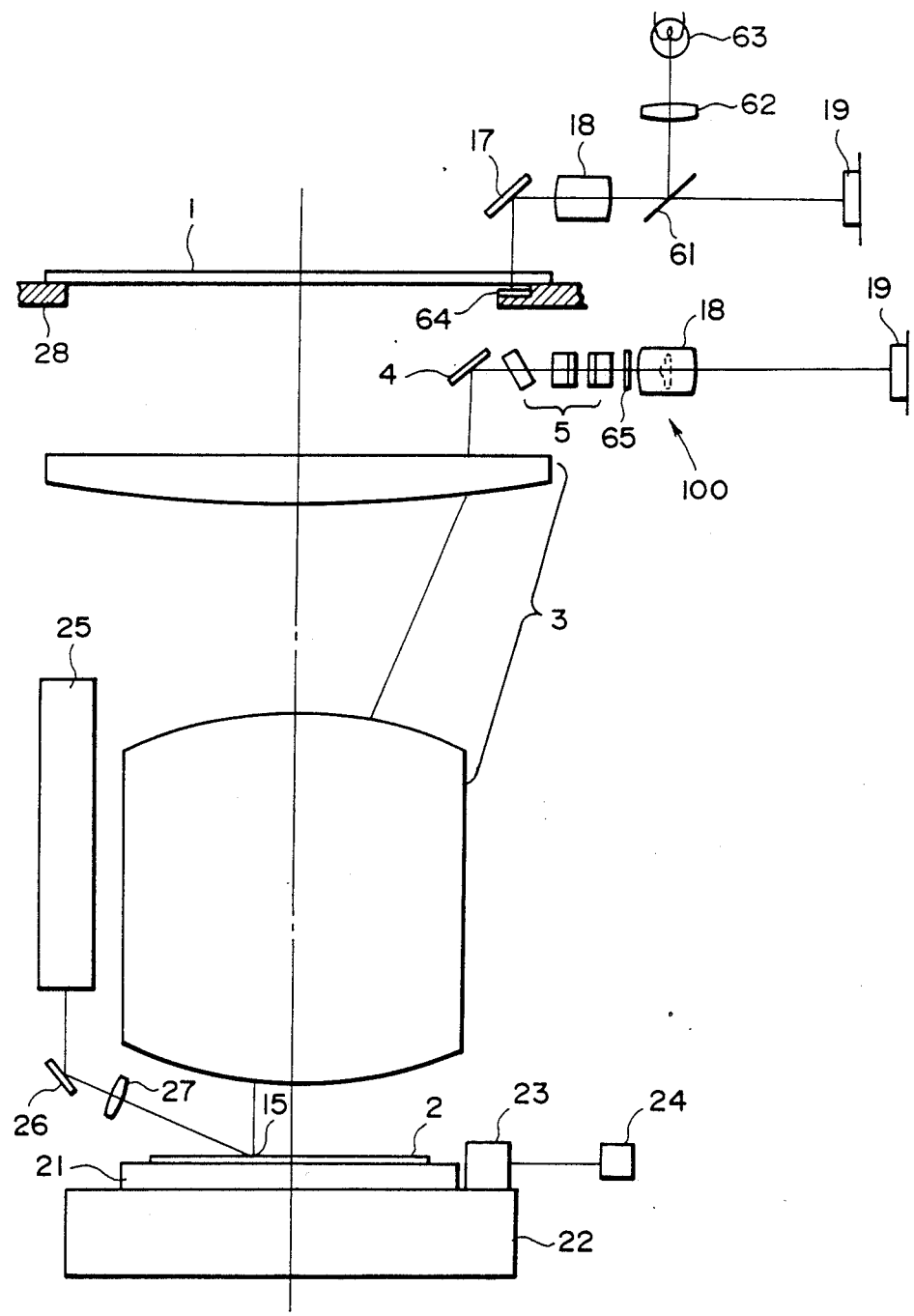
FIG. 8 is a schematic view of an optical arrangement of a semiconductor device manufacturing projection exposure apparatus into which an observation system according to a still further embodiment of the present invention is incorporated.

Referring now to FIG. 8, there is shown a semiconductor device manufacturing projection exposure apparatus, into which an observation system according to a still further embodiment of the present invention is incorporated. In this embodiment, the observation system includes two completely separated observation units. One is an alignment scope unit for observing a wafer 2, and the other is an alignment scope unit for observing a reticle 1. More specifically, the observation unit for the wafer 2 is arranged to observe only the wafer 2 which is illuminated by a laser beam from a laser 25 in a dark-field illumination manner, and also to detect any positional deviation of the wafer 2 with respect to a predetermined reference prepared in the observation unit. In the FIG. 8 embodiment, an optical element 65 is formed with a mark which is usable as the reference. However, in place of providing the reference mark at the position 65, a CCD image sensor 19 itself may be used as the reference. For the reticle 1, a predetermined reference which is separate from that for the wafer 2 is prepared. The reticle 1 is aligned with respect to such reference provided therefor. Numeral 64 in FIG. 18 denotes a reference mark which is the reference provided for the reticle 1. The reference mark 64 may be continuously observed by the observation unit provided for the reticle 1. In the alignment system of the present embodiment, it is necessary to predetect the relation between the references for the reticle 1 and the wafer 2. For this purpose, it is a possible way to once photoprint the pattern of the reticle 1 on the wafer 2 and, thereafter, to detect any "offset" between the two references. It is a possible alternative that a certain reference mark is provided at a position on which the wafer 2 is to be placed and that the position of such reference mark is measured while utilizing the accuracy of the wafer stage, or the like thereby to detect any offset between the reference marks. When a particular reference is provided on the wafer 2 side, the provision of the reference mark 64 is not always necessary. Also, for the adjustment of the reticle 1 in the $\theta$ (rotational) direction, it is preferable to provide plural observation units for the reticle 1 so as to effect the observation at plural points.

The observation of the wafer 2 by use of an optical unit 100, having substantially the same structure as of the optical unit of the FIG. 1A embodiment, allows to hold the advantageous effects of the present invention that the positional deviation in the X and Y directions from a reference point is detectable by the observation with respect to a single point.

In accordance with the present embodiment, specifically arranged correcting optical means is used to ensure exact observation of the wafer 2 by way of the projection optical system 3 and by use of a wavelength different from that to be used for the photoprinting, the wafer being observed in a sharp image. As a result, two-dimensional positional information with respect to the X and Y directions is obtainable only by single-point observation. This facilitates construction of the alignment system. In a case where any $\theta$ error between the reticle 1 and the wafer 2 is preparatorily corrected, e.g., in accordance with a known global alignment technique, the single-point observation for each shot area of the wafer assures satisfactory alignment of the reticle and the wafer.

If, on the other hand, two-point measurement is effected in each of the shot areas on the wafer, it is possible to detect the X-axis component and the Y-axis component of the positional deviation for each of the two measuring points. Accordingly, for each shot area, the reticle 1 and the wafer 2 can be aligned in respect to the X, Y and $\theta$ directions. Further, on the basis of the two-point measurement, it is possible to detect any change in the magnification e.g. by measuring the interval between the two points. Therefore, it becomes possible to take appropriate measures to correct or compensate for any error in the imaging magnification of the projection optical system 3 resulting from changes in an ambient pressure and/or temperature, as well as an error resulting from any local deformation of the wafer 2. Adjustment of the imaging magnification of the projection optical system, which is attainable in a known manner, to correct the detected magnification error assures further improvements in the alignment accuracy.

In accordance with the present invention, as has hitherto been described, various aberrations related to the "chromaticity" can be corrected controllably. Accordingly, the present invention provides an automatic alignment system which meets a resist process using a material absorptive to the photoprinting wavelength and which allows superior imaging not only by the sagittal light flux but also by the meridional light flux when a wavelength different from the photoprinting wavelength is used.

While the invention has been described with reference to the structures disclosed herein, it is not confined to the details set forth and this application is intended to cover such modifications or changes as may come within the purposes of the improvements or the scope of the following claims.

What is claimed is:

1. An observation system, usable with a projection lens system for optically projecting a first object upon a second object by use of a light of a first wavelength, for observing the second object by way of the projection lens system and by use of a light of a second wavelength different from the first wavelength, said observation system comprising:

an observation optical system having a lens element and a parallel-surface plate which is inclined with respect to an optical axis of said observation optical system;

wherein said observation optical system is arranged to form an image of the second object on a predetermined image surface and wherein said parallel-surface plate is arranged to substantially correct coma caused by the projection lens system.

2. An observation system according to claim 1, wherein said lens element is arranged to substantially correct spherical aberration.

3. An observation system according to claim 1, wherein said lens element is arranged to substantially correct astigmatism.

4. An observation system according to claim 3, wherein said lens element comprises a cylindrical lens.

5. An observation system, usable with a projection lens system for optically projecting first object upon a second object by use of a light of a first wavelength, for observing the second object by way of the projection lens system and by use of a light of a second wavelength different from the first wavelength, said observation system comprising:

first correcting means effective to correct coma caused by the projection lens system; and second correcting means effective to correct astigmatism caused in a combination of the projection lens system and said first correcting means;

wherein the second object is imaged upon a predetermined image surface, with the coma and the astigmatism being substantially corrected by said first and second correcting means.

6. An observation system according to claim 5, wherein said first correcting means comprises a parallel-surface plate which is disposed inclinedly with respect to an optical axis and in a meridional plane of the projection optical lens system.

7. An observation system according to claim 5, wherein said second correcting means comprises a plurality of parallel-surface plates which are disposed inclinedly relative to a lens axis and in a sagittal plane of the projection optical system.

8. An observation system according to claim 5, wherein said second correcting means includes a cylindrical lens.

9. An observation system according to claim 5, further comprising a lens element effective to correct spherical aberration.

10. An observation system comprising:

illumination means for illuminating a surface to be observed, by use of a light of a predetermined wavelength;

optical means for forming an image of the surface, being observed, on a predetermined image surface, said optical means having a lens system designed for use with light of a wavelength different from said predetermined wavelength;

correcting means having at least one parallel-surface plate effective to correct at least coma caused by said lens system; and observation means for observing the image of the surface, being observed, formed on said predetermined image surface.

11. A projection exposure apparatus for use with a mask having a pattern and a wafer, said apparatus comprising:

first supporting means for supporting the mask;
second supporting means for supporting the wafer;

projection lens means for projecting the pattern of the mask upon the by use of a light of a first wavelength;

illumination means for illuminating a predetermined portion of the wafer by use of a light of a second wavelength different from said first wavelength;

optical means for forming, with an aid of said projection lens means, an image of said predetermined portion of the wafer on a predetermined image surface, said optical means including aberration correcting means effective to correct at least coma caused by said projection lens means; and observation means for observing the image of said predetermined portion of the wafer, formed on said predetermined image surface.

12. An apparatus according to claim 11, wherein said aberration correcting means is arranged to substantially correct astigmatism.

13. An apparatus according to claim 12, wherein said aberration correcting means is arranged to substantially correct spherical aberration.

14. An apparatus according to claim 11, wherein said aberration correcting means includes:

a parallel-surface plate disposed inclinedly relative to an optical axis and in an meridional plane of said projection lens means, said parallel-surface plate being effective to correct comma caused by said projection lens means; and a plurality of parallel surface plates disposed inclinedly relative to the optical axis and in a sagittal plane of said projection means, said plurality of parallel-surface plates being effective to correct astigmatism caused by the first-mentioned parallel-surface plate and said projection lens means.

15. An apparatus according to claim 11, wherein said aberration correcting means includes:

a parallel-surface plate disposed inclinedly relative to an optical axis and in a meridional plane of said projection lens system, said parallel-surface plate being effective to correct coma caused by said projection lens system; and a cylindrical lens effective to correct astigmatism caused by said parallel-surface plate.

16. An apparatus according to claim 14, wherein said aberration correcting means further includes an optical member having an aspherical surface which is disposed at a position substantially optically conjugate with a pupil of said projection lens means.

17. An observation system, usable with a projection lens system for optically projecting an image of a first object upon a second object by use of a light of a first wavelength, for observing the second object by way of the projection lens system and by use of a light of a second wavelength different from the first wavelength, said observation system comprising:

an illumination system for illuminating the second object with the light of the second wavelength; and a correcting optical system cooperable with the projection lens system to form an image of the second object on a predetermined image plane, said correcting optical system being effective to substantially correct astigmatism caused by the projection lens system.

18. An observation system according to claim 17, wherein said correcting optical system is further effective to substantially correct coma caused by said projection lens systems.

19. An observation system according to claim 17, wherein said correcting optical system includes a parallel surface plate disposed inclinedly with respect to an optical axis of said correcting optical system.

20. An observation system according to claim 17, wherein said correcting optical system includes a cylindrical lens.

21. An observation system, usable with a projection lens system for optically projecting an image of a first object upon a second object by use of a light of a first wavelength, for observing the second object by way of the projection lens system and by use of a light of a second wavelength different from the first wavelength, said observation system comprising:
an illuminating system for illuminating the second object with the light of the second wavelength; and
a correcting optical system cooperable with the projection lens system to form an image of the second object on a predetermined image plane, said correcting optical system being effective to substantially correct coma caused by the projection lens system.

22. An observation system according to claim 21, wherein said correcting optical system includes a parallel surface plate disposed inclinedly with respect to an optical axis of said correcting optical system.

23. An observation system, comprising:
illumination means for illuminating a surface, being examined, by use of a light of a predetermined wavelength;
optical means for forming an image of the surface on a predetermined image plane, said optical means having a lens system for use with a light of a wavelength different from said predetermined wavelength;
correcting means having a correcting optical element for substantially correcting astigmatism caused by said lens system; and
observation means for observing the image of the surface formed on the predetermined image plane.

24. An observation system according to claim 23, wherein said correcting optical element comprises a parallel surface plate disposed inclinedly with respect to an optical axis of said correcting means.

25. An observation system according to claim 23, wherein said correcting optical element comprises a cylindrical lens.

26. An observation system, usable with a projection optical system for projecting an image upon an object by use of a light of a first wavelength, for observing the object by way of the light projection optical system, said observation system comprising:
an illumination system arranged to illuminate the object outside of the projection optical system, and in a direction inclined with respect to an optical axis of the projection optical system, by use of a light of a second wavelength different from the first wavelength; and
an image forming optical system disposed to receive light scattered by the object being illuminated by said illumination system and passed through the projection optical system, for forming an image of the object on a predetermined plane, said image forming optical system including a first chromatic aberration correcting optical element effective to substantially correct coma caused by the projection optical system.

27. An observation system according to claim 26, wherein said image forming optical system further includes a second chromatic aberration correcting optical element effective to substantially correct astigmatism caused by the projection optical system.

28. An observation system according to claim 26, wherein said image forming optical system further includes a third chromatic aberration correcting optical system effective to substantially correct spherical aberration caused by the projection optical system.

29. An observation system, usable with a projection optical system for projecting an image upon an object by use of a light of a first wavelength, for observing the object by way of the projection optical system, said observation system comprising:
an illumination system arranged to illuminate the object outside of the projection optical system, and in a direction inclined with respect to an optical axis of the projection optical system, by use of a light of a second wavelength different from the first wavelength; and
an image forming optical system disposed to receive a light scattered by the object, being illuminated by said illumination system, and passed through the projection optical system, for forming an image of the object on a predetermined plane, said image forming optical system including a chromatic aberration correcting optical element effective to substantially correct astigmatism caused by the projection optical system.

30. An observation system according to claim 29, wherein said image forming optical system further includes a second chromatic aberration correcting optical system effective to substantially correct spherical aberration caused by the projection optical system.

31. Projection exposure apparatus, comprising:
a mask stage for supporting a mask;
a wafer stage for supporting a wafer;
a projection optical system for projecting a pattern of the mask upon the wafer with light of a first wavelength;
illumination means for illuminating the wafer with light of a second wavelength different from the first wavelength;
a correction optical system cooperable with said projection optical system to form an image of a mark of the wafer illuminated by said illumination means, said correction optical system being effective to substantially correct astigmatism caused by said projection optical system; and
observation means for observing the image of the mark formed.

32. An apparatus according to claim 31, wherein said correction optical system includes a parallel surface plate inclined with respect to an optical axis of said correction optical system.

33. An apparatus according to claim 32, wherein the inclination of said parallel surface plate is adjustable.

34. An apparatus according to claim 31, wherein said correction optical system includes a cylindrical lens.

35. An apparatus according to claim 31, wherein said illumination means includes a laser for producing light having the second wavelength.

36. An apparatus according to claim 31, wherein said correction optical system is also effective to substantially correct coma caused by said projection optical system.

37. Projection exposure apparatus, comprising:

a mask stage for supporting a mask;

a wafer stage for supporting a wafer;

a projection optical system for projecting a pattern of the mask upon the wafer with light of a first wavelength;

illumination means for illuminating the wafer with light of a second wavelength different from the first wavelength;

a correction optical system cooperable with said projection optical system to form an image of a mark of the wafer illuminated by said illumination means, said correction optical system being effective to substantially correct coma caused by said projection optical system; and observation means for observing the image of the mark formed.

38. An apparatus according to claim 37, wherein said correction optical system includes a parallel surface plate inclined with respect to an optical axis of said correction optical system.

39. An apparatus according to claim 38, wherein the inclination of said parallel surface plate is adjustable.

40. An apparatus according to claim 37, wherein said illumination means includes a laser for producing light having the second wavelength.

41. An apparatus according to claim 37, wherein said correction optical system includes an optical element effective to substantially correct spherical aberration caused by said projection optical system.

42. An observation device for observing an object through a projection optical system, and for projecting a pattern upon the object by use of light of a first wavelength, the observation being made by use of light of a second wavelength different from the first wavelength, said device comprising:

illumination means for illuminating the object with the light of the second wavelength; and a correction optical system for substantially correcting astigmatism cause by the projection optical system and for forming an image of the object through the projection optical system.

43. An observation system for observing an object through a projection optical system, and for projecting a pattern upon the object by use of light of a first wavelength, the observation being made by use of light of a second wavelength different from the first wavelength, said device comprising;

illumination means for illuminating the object with the light of the second wavelength; and a correction optical system for substantially correcting coma caused by the projection optical system and for forming an image of the object through the projection optical system.

* * * * *

UNITED STATES PATENT AND TRADEMARK OFFICE
CERTIFICATE OF CORRECTION

PATENT NO. :  4,888,614  Page 1 of 2
DATED     :  December 19, 1989
INVENTOR(S) :  Suzuki, et al.

It is certified that error appears in the above-identified patent and that said Letters Patent is hereby corrected as shown below:

COLUMN 3:

Line 21, "wherein" should be deleted.

Line 67, "parallel-c surface" should read --parallel-surface--.

COLUMN 5:

Line 32, "plan" should read --plane--.

COLUMN 7:

Line 5, "Thus" should read --Thus,--.

COLUMN 9:

Line 57, "axis" should read --axis,--.

COLUMN 10:

Line 13, "may" should read" --may be--.

UNITED STATES PATENT AND TRADEMARK OFFICE
CERTIFICATE OF CORRECTION

PATENT NO. : 4,888,614

DATED : December 19, 1989

INVENTOR(S) : Suzuki, et al.

It is certified that error appears in the above-identified patent and that said Letters Patent is hereby corrected as shown below:

COLUMN 17:

Line 6, "substantially/y" should read --substantially--.

Line 41, "projection optical system." should read --projection lens system.--

COLUMN 18:

Line 2, "the by" should read --the wafer by--.

COLUMN 22:

Line 12, "cause" should read --caused--.

Line 20, "comprising;" should read --comprising:--.

Signed and Sealed this

Twenty-fifth Day of June, 1991

Attest:

*Attesting Officer*

HARRY F. MANBECK, JR.

*Commissioner of Patents and Trademarks*